US012610638B2

(12) United States Patent　　(10) Patent No.:　US 12,610,638 B2
Cho　　　　　　　　　　　　　　(45) Date of Patent:　　Apr. 21, 2026

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventor: Kyongsoon Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 462 days.

(21) Appl. No.: 18/358,478

(22) Filed: Jul. 25, 2023

(65) Prior Publication Data

US 2024/0213192 A1　　Jun. 27, 2024

(30) Foreign Application Priority Data

Dec. 27, 2022　(KR) ........................ 10-2022-0185238

(51) Int. Cl.
*H01L 23/00*　　(2006.01)
*H01L 23/48*　　(2006.01)
*H10F 39/00*　　(2025.01)

(52) U.S. Cl.
CPC ............ *H01L 24/05* (2013.01); *H01L 23/481* (2013.01); *H01L 24/13* (2013.01); *H01L 24/32* (2013.01); *H10F 39/804* (2025.01); *H01L 2224/02372* (2013.01); *H01L 2224/05548* (2013.01);
(Continued)

(58) Field of Classification Search
CPC ....... H01L 24/05; H01L 23/481; H01L 24/13; H01L 24/32; H01L 2224/02372; H01L 2224/05548; H01L 2224/13025; H01L 2224/32245; H01L 2924/13091; H01L 24/04; H01L 22/32; H01L 23/06; H01L 23/3128; H01L 24/14; H01L 24/49; H01L 2224/02331; H01L 2224/0235; H01L 2224/02373; H01L 2224/02381; H01L 2224/0612; H10F 39/804; H10F 39/811
See application file for complete search history.

(56) References Cited

U.S. PATENT DOCUMENTS 8,228,426 B2　7/2012　Matsuo et al.
8,383,447 B2　2/2013　Yang
8,514,308 B2　8/2013　Itonaga et al.
(Continued)

FOREIGN PATENT DOCUMENTS

CN　　　111627947 A　　9/2020

*Primary Examiner* — Fernando L Toledo
*Assistant Examiner* — Shawn Shaw Muslim
(74) *Attorney, Agent, or Firm* — Wolf, Greenfield & Sacks, P.C.

(57)　　　　ABSTRACT

A semiconductor package includes a silicon substrate including a plurality of through openings, and a redistribution wiring layer including a first surface and a second surface opposite the first surface, the second surface facing the silicon substrate, the redistribution wiring layer including a first pad area and a second pad area. The redistribution wiring layer includes a plurality of bonding pads on the first pad area at the first surface, a plurality of test pads on the second pad area at the first surface, a plurality of landing pads on the second pad area at the second surface, the plurality of landing pads in communication with the plurality of through openings, respectively, and a plurality of redistribution wires electrically connected to the plurality of bonding pads and the plurality of landing pads.

20 Claims, 13 Drawing Sheets

14

(52) U.S. Cl.
     CPC ............... *H01L 2224/13025* (2013.01); *H01L 2224/32245* (2013.01); *H01L 2924/13091* (2013.01)

(56)                    References Cited

U.S. PATENT DOCUMENTS

| | | |
|---|---|---|
| 9,177,919 B2 | 11/2015 | Liu et al. |
| 9,640,580 B2 | 5/2017 | Lee et al. |
| 9,955,097 B2 | 4/2018 | Iwabuchi et al. |
| 9,960,102 B2 | 5/2018 | Wu et al. |
| 9,972,584 B2 | 5/2018 | Shen et al. |
| 10,431,615 B2 | 10/2019 | Jeong et al. |
| 10,615,212 B2 | 4/2020 | Jung et al. |
| 11,387,189 B2 | 7/2022 | Suzuki et al. |
| 2024/0047324 A1* | 2/2024 | Hwang ................ H01L 21/565 |

* cited by examiner

FIG. 9

SEMICONDUCTOR PACKAGE AND METHOD OF MANUFACTURING THE SEMICONDUCTOR PACKAGE

PRIORITY STATEMENT

This application claims priority under 35 U.S.C. § 119 to Korean Patent Application No. 10-2022-0185238, filed on Dec. 27, 2022 in the Korean Intellectual Property Office (KIPO), the contents of which are herein incorporated by reference in their entirety.

BACKGROUND

Example embodiments relate to a semiconductor package and a method of manufacturing the semiconductor package. More particularly, example embodiments relate to a semiconductor package having a chip scale package structure and a method of manufacturing the semiconductor package.

A chip scale package (CSP) structure may be used in image sensor products. The image sensor products may use a wire bonding structure. A camera module size of the image sensor product may be reduced for aesthetics and usability. A through silicon via structure may reduce the camera module size. When the through silicon via structure is used in the wire bonding structure, an additional space may be required in a semiconductor package, and a size of the semiconductor package may increase.

SUMMARY

Example embodiments provide a semiconductor package having a space utilization structure capable of selectively including bonding wires or through silicon vias.

Example embodiments provide a method of manufacturing the semiconductor package.

According to example embodiments, a semiconductor package includes a silicon substrate including a plurality of through openings, and a redistribution wiring layer including a first surface and a second surface opposite the first surface, the second surface facing the silicon substrate, the redistribution wiring layer including a first pad area and a second pad area. The redistribution wiring layer includes a plurality of bonding pads on the first pad area at the first surface, a plurality of test pads on the second pad area at the first surface, a plurality of landing pads on the second pad area at the second surface, the plurality of landing pads in communication with the plurality of through openings, respectively, and a plurality of redistribution wires electrically connected to the plurality of bonding pads and the plurality of landing pads.

According to example embodiments, a semiconductor package includes a silicon substrate including a plurality of through openings, and a redistribution wiring layer including a first surface and a second surface opposite the first surface, the redistribution wiring layer on the silicon substrate such that the second surface faces the silicon substrate, the redistribution wiring layer having first and second pad areas on an edge region that surrounds a central region. The redistribution wiring layer includes a plurality of bonding pads on the first pad area at the first surface, a plurality of test pads on the second pad area at the first surface, a plurality of landing pads on the second pad area at the second surface, the plurality of landing pads in communication with the plurality of through openings, respectively, and a plurality of redistribution wires electrically connected to the plurality of bonding pads and the plurality of landing pads.

According to example embodiments, a semiconductor package includes a silicon substrate, a redistribution wiring layer on the silicon substrate such that a lower surface of the redistribution wiring layer faces the silicon substrate, the redistribution wiring layer including first and second pad areas on an edge region that surrounds a central region, and a plurality of through electrodes extending through the silicon substrate. The redistribution wiring layer includes a plurality of bonding pads on the first pad area at an upper surface, a plurality of test pads on the second pad area at the upper surface of the redistribution wiring layer, a plurality of landing pads on the second pad area at the lower surface of the redistribution wiring layer, the plurality of landing pads electrically connected to the plurality of through electrodes, and a plurality of redistribution wires electrically connected to the plurality of bonding pads and the plurality of landing pads.

According to example embodiments, a semiconductor package may include a silicon substrate having a plurality of through openings, and a redistribution wiring layer having a first surface and a second surface opposite to the first surface, the second surface facing the silicon substrate, the redistribution wiring layer having a first pad area and a second pad area. The redistribution wiring layer may include a plurality of bonding pads provided on the first pad area to be exposed from the first surface, a plurality of test pads provided on the second pad area to be exposed from the first surface, a plurality of landing pads provided on the second pad area on the second surface, the plurality of landing pads exposed toward the plurality of through openings, respectively, and a plurality of redistribution wires electrically connected to the plurality of bonding pads and the plurality of landing pads.

Thus, the semiconductor package may be electrically connected to other semiconductor devices through bonding wires that are formed on the bonding pads by a wire bonding process. Alternatively, the semiconductor package may be electrically connected to the other semiconductor device by through silicon vias that are formed on the landing pads. The bonding pads and the landing pads may be electrically connected through the redistribution wires to perform a same circuit function. The semiconductor package may have a structure capable of selectively including the bonding wires or the through silicon vias through the bonding pads or the landing pads.

Also, the redistribution wiring layer may divide the second pad area having the test pads and the landing pads, and the first pad area having the bonding pads. Since the test pads are provided on the second pad area where the landing pads are provided, space utilization of the redistribution wiring layer may be increased or improved.

BRIEF DESCRIPTION OF THE DRAWINGS

Example embodiments will be more clearly understood from the following detailed description taken in conjunction with the accompanying drawings.

FIGS. 1 to 13 represent non-limiting, example embodiments as described herein.

FIG. 1 is a plan view illustrating a semiconductor device having a semiconductor package in accordance with example embodiments.

FIG. 2 is a cross-sectional view taken along the line A-A' in FIG. 1.

FIG. 3 is a plan view illustrating a through electrode region on a silicon substrate.

FIG. 4 is an enlarged cross-sectional view illustrating portion 'B' in FIG. 2.

FIGS. 5 to 10 are views illustrating a method of manufacturing the semiconductor device having the semiconductor package in FIG. 1.

FIG. 11 is a plan view illustrating a semiconductor package having an arrangement of bonding pads and test pads crossing each other in accordance with example embodiments.

FIG. 12 is a cross-sectional view illustrating a semiconductor package having bonding wires in accordance with example embodiments.

FIG. 13 is a cross-sectional view illustrating a semiconductor package having through electrodes in accordance with example embodiments.

DETAILED DESCRIPTION

Hereinafter, example embodiments will be explained in detail with reference to the accompanying drawings.

Figure 1:
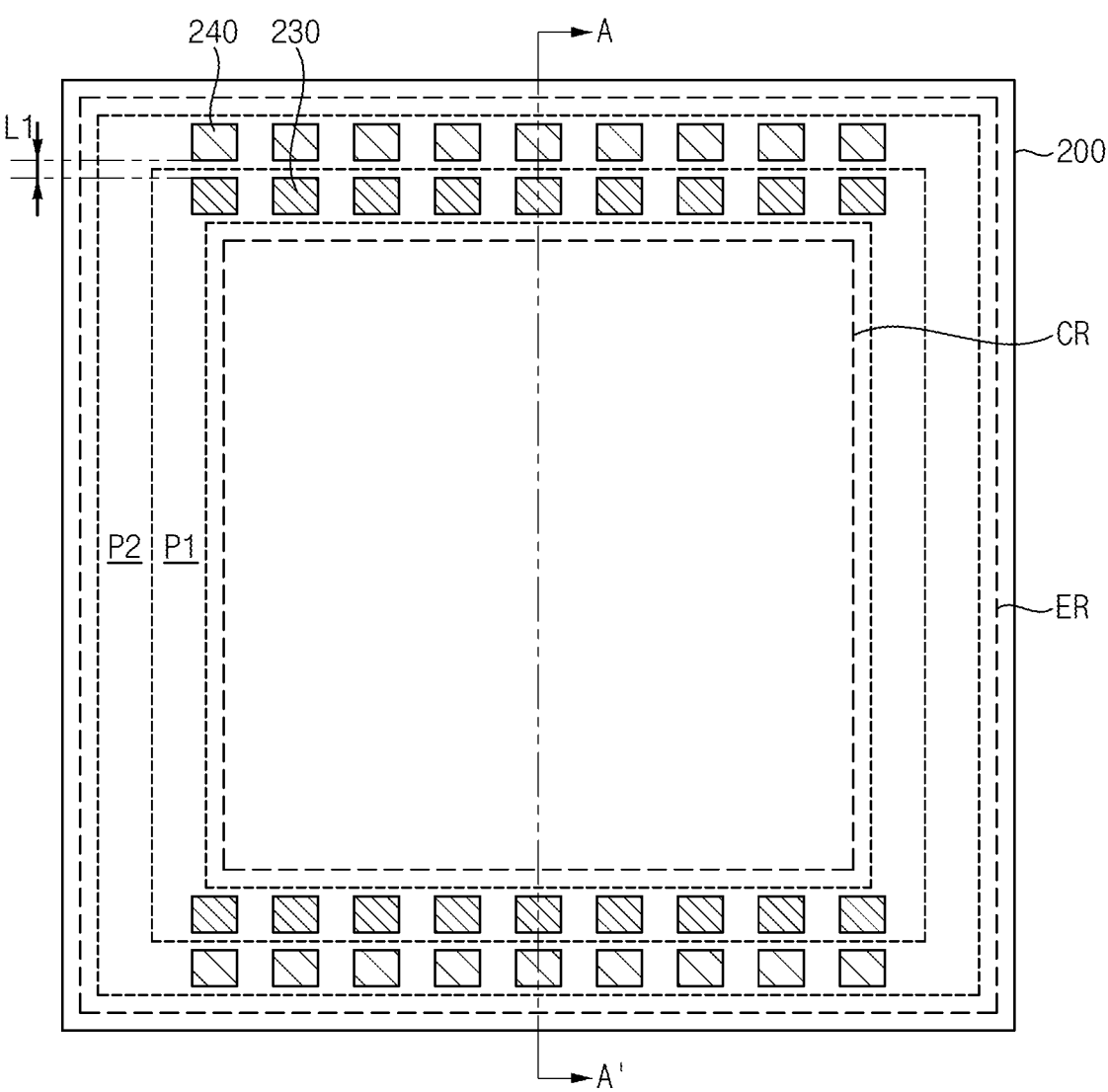
Figure 2:
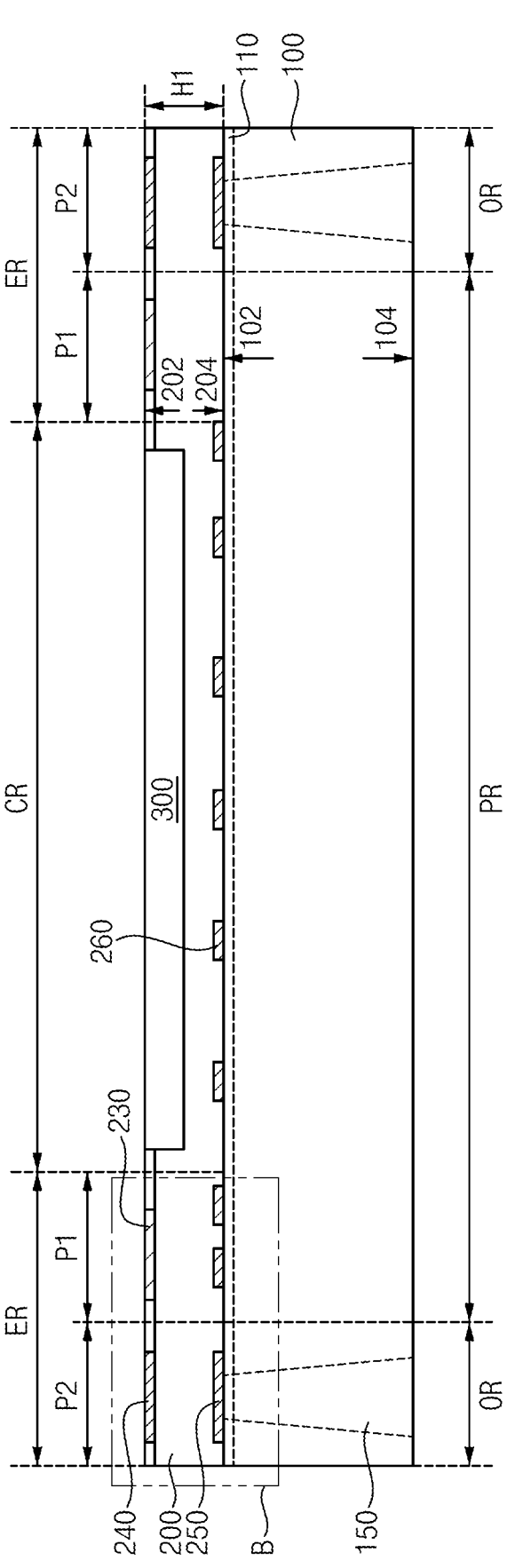
Figure 3:
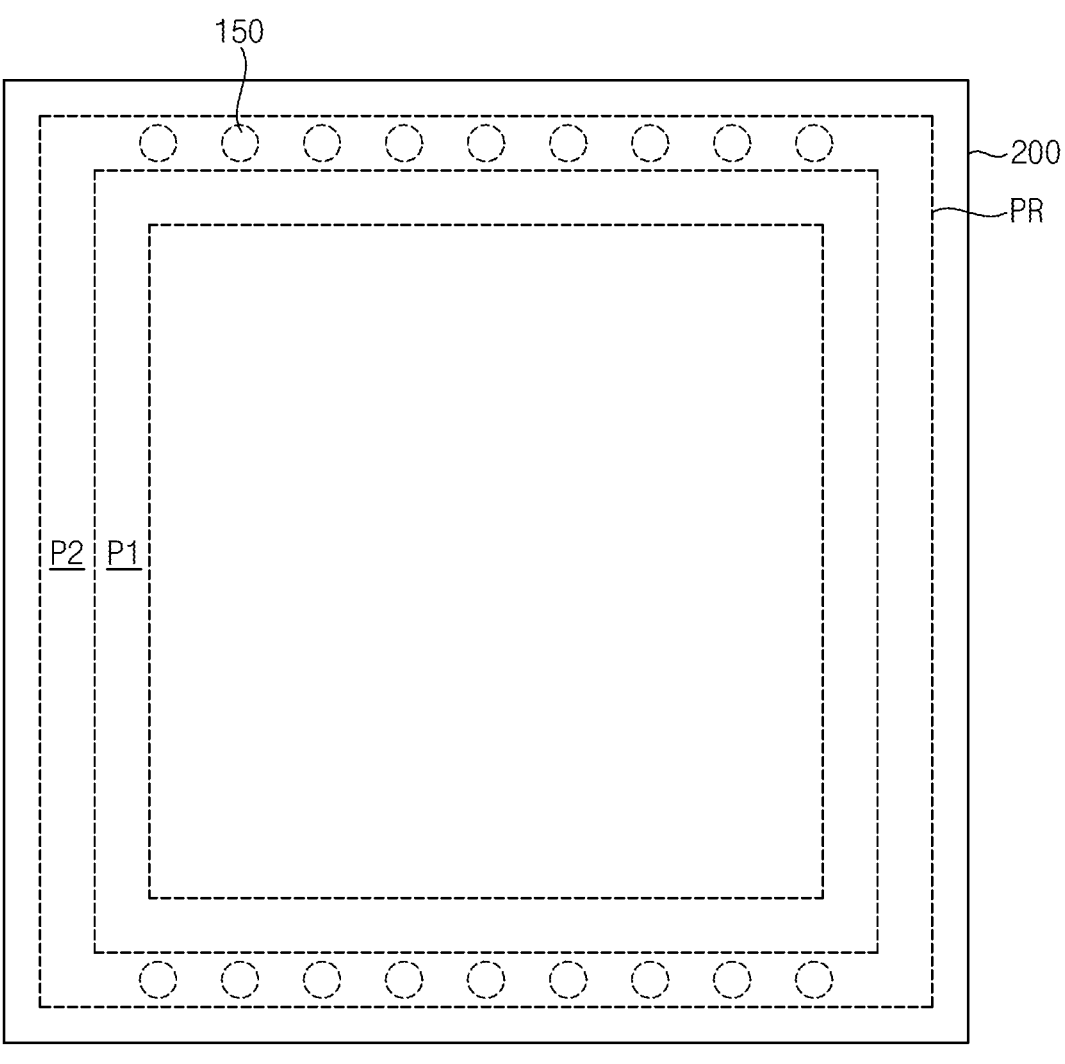
Figure 4:
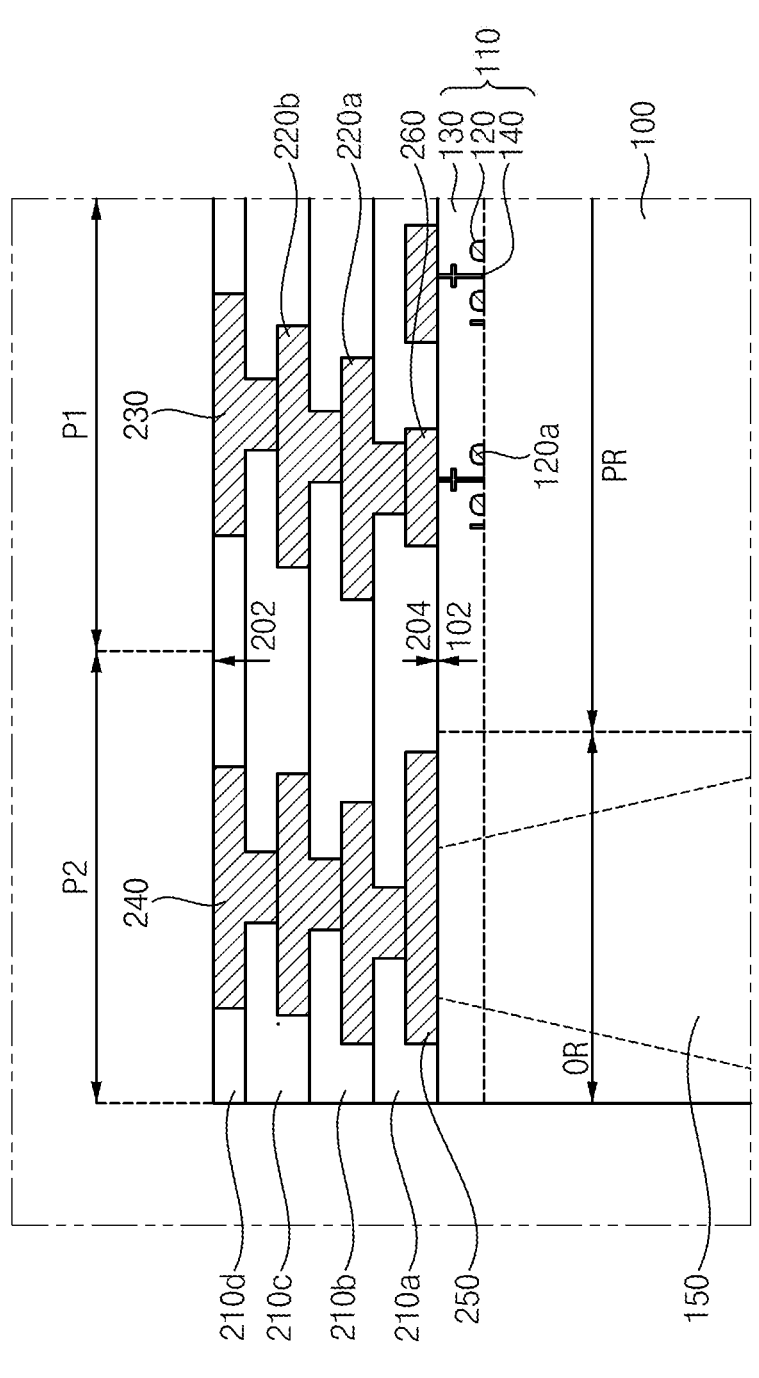

FIG. 1 is a plan view illustrating a semiconductor device having a semiconductor package in accordance with example embodiments. FIG. 2 is a cross-sectional view taken along the line A-A' in FIG. 1. FIG. 3 is a plan view illustrating a through electrode region on a silicon substrate. FIG. 4 is an enlarged cross-sectional view illustrating portion 'B' in FIG. 2.

Referring to FIGS. 1 to 4, a semiconductor package 10 may include a silicon substrate 100 having an active layer 110, a redistribution wiring layer 200 provided on the silicon substrate 100, and an optical component 300 provided on the redistribution wiring layer 200. For example, the semiconductor package 10 may be referred to as a semiconductor module capable of forming an image sensor chip.

For example, the image sensor chip may include a complementary metal oxide semiconductor (CMOS) image sensor chip. The CMOS image sensor (CIS) chip may include an active pixel area capable of capturing an image, and a CMOS logic area capable of controlling an output signal of the active pixel area. The active pixel area may include a photodiode and a MOS transistor, and the CMOS logic area may include a plurality of CMOS transistors.

In example embodiments, the silicon substrate 100 may have an upper surface 102 and a lower surface 104 opposite to the upper surface. The upper surface 102 of the silicon substrate 100 may be referred to as an active surface, and the lower surface 104 may be referred to as an inactive surface. The active layer 110 having circuit patterns may be provided on the upper surface 102 of the silicon substrate 100. The upper surface 102 may be referred to as a front side surface on which the circuit patterns are provided. The lower surface 104 may be referred to as a back side surface.

For example, the silicon substrate 100 may include a semiconductor material such as silicon, germanium, or silicon-germanium. The silicon substrate 100 may include a III-V compound semiconductor such as gallium phosphide (GaP), gallium arsenide (GaAs), or gallium antimonide (GaSb). The silicon substrate 100 may include a silicon-on-insulator (SOI) substrate or a germanium-on-insulator (GOI) substrate.

The silicon substrate 100 may have the active layer 110 provided on the upper surface 102. The active layer 110 may include a through opening region OR, and a circuit pattern region PR surrounded by the through opening region OR and providing a space capable of forming the circuit patterns. The through opening region OR may referred to as a region where a plurality of through electrodes (TSV, through silicon via) are formed.

The silicon substrate 100 may include a plurality of through openings 150 that penetrate or extend through the silicon substrate 100 in a vertical direction. The plurality of through openings 150 may be provided on the through opening region OR.

The through opening region OR may be referred to as a region inside the active layer 110 that does not include metal materials. The through opening region OR may be referred to as a region capable of forming the through electrode to penetrate the silicon substrate 100 in a thickness direction. The metal materials may include aluminum (Al), copper (Cu), tin (Sn), nickel (Ni), gold (Au), platinum (Pt), or an alloy thereof.

The active layer 110 may include an interlayer insulating layer 130, and a plurality of connection wires 140 provided in the interlayer insulating layer 130. The interlayer insulating layer 130 may cover the circuit patterns on the silicon substrate 100. The connection wires 140 may be electrically connected to the circuit patterns. The connection wires 140 may be electrically connected to the redistribution wiring layer 200. The interlayer insulating layer may include silicon oxide, carbon-doped silicon oxide, silicon carbonitride (SiCN), or the like.

For example, the circuit patterns may include transistors, diodes, capacitors, and the like. The circuit patterns may constitute circuit elements. Thus, the semiconductor package 10 may be referred to as a semiconductor device in which a plurality of the circuit elements are provided.

In example embodiments, the redistribution wiring layer 200 may be provided on the upper surface 102 of the silicon substrate 100. The redistribution wiring layer 200 may include a first surface 202 and a second surface 204 opposite to each other. The redistribution wiring layer 200 may be provided on the silicon substrate 100 such that the second surface 204 faces the upper surface 102 of the silicon substrate 100. The first surface 202 of the redistribution wiring layer 200 may be spaced apart from the second surface 204 of the redistribution wiring layer 200 such that the redistribution wiring layer 200 has a first height H1.

In example embodiments, the optical component 300 may be provided on the first surface 202 of the redistribution wiring layer 200. The optical component 300 may include a lens capable of obtaining light. The optical component 300 may be exposed from the first surface 202 of the redistribution wiring layer 200. An upper surface of the optical component 300 may be coplanar with the first surface 202 of the redistribution wiring layer 200. A plane area of the optical component 300 may be smaller than a plane area of the redistribution wiring layer 200. The optical component 300 may be disposed within the plane area of the redistribution wiring layer 200 when viewed from a plan view. The optical component 300 may be disposed such that the lens faces an opposite direction of the redistribution wiring layer 200.

The optical component 300 may detect the incident light through the lens. For example, the optical component 300 may include a micro lens, a color filter layer, and the like. The optical component 300 may include a sensing element, a light sensing element, an optoelectronic element, a temperature sensing element, a capacitance sensing element, and the like.

The redistribution wiring layer 200 may include a plurality of redistribution wires 220. The redistribution wiring layer 200 may include a plurality of first landing pads 250 and a plurality of second landing pads 260 that are provided to be exposed from a lower surface, that is, the second surface 204 of the redistribution wiring layer 200. The plurality of first landing pads 250 and the plurality of second landing pads 260 may be at or on the second surface 204 of the redistribution wiring layer 200. The redistribution wiring layer 200 may include a plurality of bonding pads 230 and a plurality of test pads 240 that are provided to be exposed from an upper surface of the redistribution wiring layer 200, that is, the first surface 202. The plurality of bonding pads 230 and the plurality of test pads 240 may be at or on the first surface 202 of the redistribution wiring layer 200.

The redistribution wiring layer 200 may have a central region CR, and an edge region ER surrounding the central region CR. The redistribution wiring layer 200 may have a first pad area P1 and a second pad area P2. The first pad area P1 may be referred to as an area where the plurality of bonding pads 230 electrically connected to bonding wires are formed. The second pad area P2 may be referred to as an area where a test pad 240 capable of testing reliability and the first landing pad 250 electrically connected to the through electrode are formed. The first pad area P1 may be between the central region CR and the second pad area P2. The second pad area P2 may surround the first pad area P1.

The first and second pad areas P1 and P2 may be provided on the edge region ER. The first and second pad areas P1 and P2 may be spaced apart from each other. The first pad area P1 may have an area vertically overlapping with the circuit pattern region PR of the silicon substrate 100. The second pad area P2 may have an area vertically overlapping with the through opening region OR of the silicon substrate 100.

In example embodiments, the redistribution wiring layer 200 may include a plurality of insulating layers 210a, 210b, 210c, and 210d, and the plurality of redistribution wires 220a and 220b provided in the plurality of insulating layers. The insulating layer may include a polymer or a dielectric layer. The insulating layer may be formed by a vapor deposition process, a spin coating process, or the like. The redistribution wires may be formed by a plating process, an electroless plating process, a vapor deposition process, or the like. The redistribution wires 220a and 220b may be electrically connected to the bonding pads 230, the test pads 240, and the first and second landing pads 250 and 260.

In example embodiments, the insulating layers 210 may cover the redistribution wires 220. The first insulating layer (lowest or lowermost insulating layer) 210a may be provided on the second surface 204 of the redistribution wiring layer 200, and the fourth insulating layer (uppermost insulating layer) 210d may be provided on the first surface 202 of the redistribution wiring layer 200.

Particularly, the plurality of first and second landing pads 250 and 260 may be provided in the first insulating layer 210a. Lower surfaces of the first and second landing pads 250 and 260 may be exposed from a lower surface of the first insulating layer 210a, that is, the second surface 204 of the redistribution wiring layer 200. Lower surfaces of the first and second landing pads 250 and 260 may be coplanar with the lower surface of the first insulating layer 210a or the second surface 204 of the redistribution wiring layer 200. The first insulating layer 210a may have first openings that expose or receive upper surfaces of the first and second landing pads 250 and 260. The first landing pads 250 may be provided on the second pad area P2. Lower surfaces of the first landing pads 250 may be exposed through or be in communication with the through openings 150 of the silicon substrate 100.

The first redistribution wires 220a may be provided on the first insulating layer 210a. The second insulating layer 210b may be provided on the first insulating layer 210a, and may have second openings that expose or receive the first redistribution wires 220a. The first redistribution wires 220a may be formed on the first and second landing pads 250 and 260. The first redistribution wires 220a may contact the first and second landing pads 250 and 260 through the first openings.

The second redistribution wires 220b may be provided on the second insulating layer 210b. The third insulating layer 210c may be provided on the second insulating layer 210b, and may have third openings that expose or receive the second redistribution wires 220b. The second redistribution wires 220b may be formed on the first redistribution wires 220a. The second redistribution wires 220b may contact the first redistribution wires 220a through the second openings.

The bonding pads 230 and the test pads 240 may be provided on the third insulating layer 210c. The fourth insulating layer 210d may be provided on the third insulating layer 210c, and may have fourth openings that expose or receive the bonding pads 230 and the test pads 240. The bonding pads 230 and the test pads 240 may contact the second redistribution wires 220b through the third openings.

The bonding pads 230 may be provided on the first pad area P1. The test pads 240 may be provided on the second pad area P2. The bonding pad 230 and the test pad 240 may be spaced apart from each other to have a first distance L1. Since the bonding pad 230 and the test pad 240 may be spaced apart from each other by the first distance L1, the through opening region OR capable of forming the through electrode may be secured in the silicon substrate 100.

The first landing pads 250 may be electrically connected to the through electrodes that are formed on the through opening region OR. The second landing pad 260 may be electrically connected to the circuit pattern 120 through the connection wire 140. The first landing pads 250 may be provided on the second pad area P2 where the test pads 240 are provided. The bonding pads 230 may be provided on the first pad area P1 that is spaced apart from the second pad area P2.

Since the first landing pads 250 are formed on the same first pad area P1 as the test pads 240, the through opening region OR capable of forming the through electrode electrically connected to the first landing pad 250 may be secured on the silicon substrate 100. The first landing pad 250 and the test pad 240 may be spaced apart from each other by a first height or second distance H1. For example, the first height H1 may be within a range of 10 μm to 20 μm.

The redistribution wires 220, the bonding pads 230, the test pads 240, and the first and second landing pads 250 and 260 may include a metal material. For example, the metal material may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), or alloys thereof.

In example embodiments, a buffer layer pattern may be provided between the interlayer insulating layer 130 and the redistribution wiring layer 200. The buffer layer pattern may serve to prevent diffusion of a conductive material of the through electrode into the substrate. The buffer layer pattern may include silicon nitride, silicon carbon nitride, or the like.

As described above, the semiconductor package 10 may be electrically connected to other semiconductor devices through the bonding wires that are formed on the bonding pads 230 by a wire bonding process. Alternatively, the semiconductor package 10 may be electrically connected to the other semiconductor device by through electrodes 90 (see, e.g., FIG. 13) that are formed on the landing pads 250. The bonding pads 230 and the landing pads 250 may be electrically connected through the redistribution wires 220 to perform a same circuit function. The semiconductor package 10 may have a structure capable of selectively including the bonding wires or the through electrodes through the bonding pads 230 or the landing pads 250.

Also, the redistribution wiring layer 200 may divide the second pad area P2 having the test pads 240 and the landing pads 250, and the first pad area P1 having the bonding pads 230. Since the test pads 240 are provided on the second pad area P2 where the landing pads 250 are provided, space utilization of the redistribution wiring layer 200 may be increased.

Hereinafter, a method of manufacturing the semiconductor package in FIG. 1 will be described.

Figure 5:
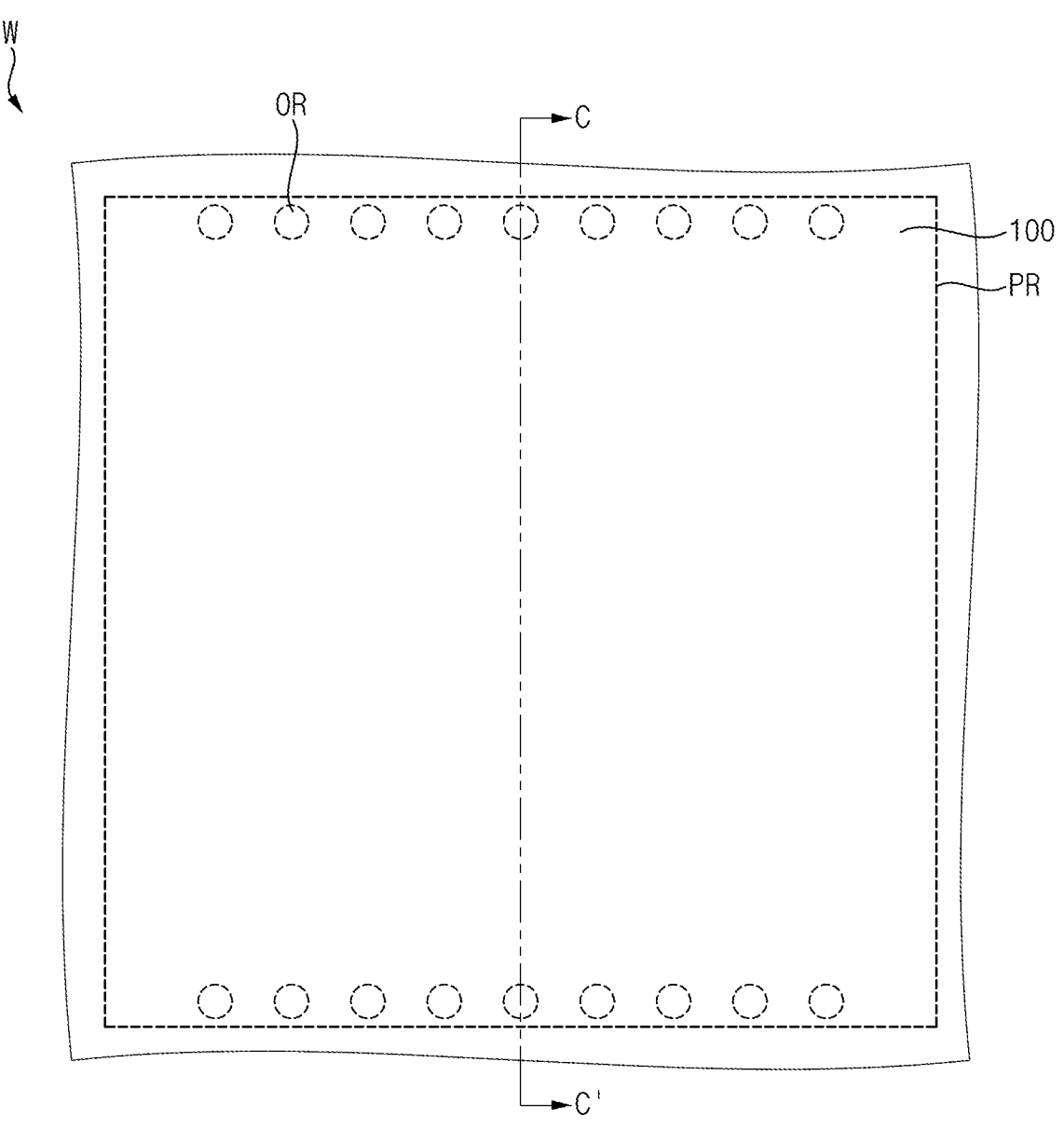
Figure 6:
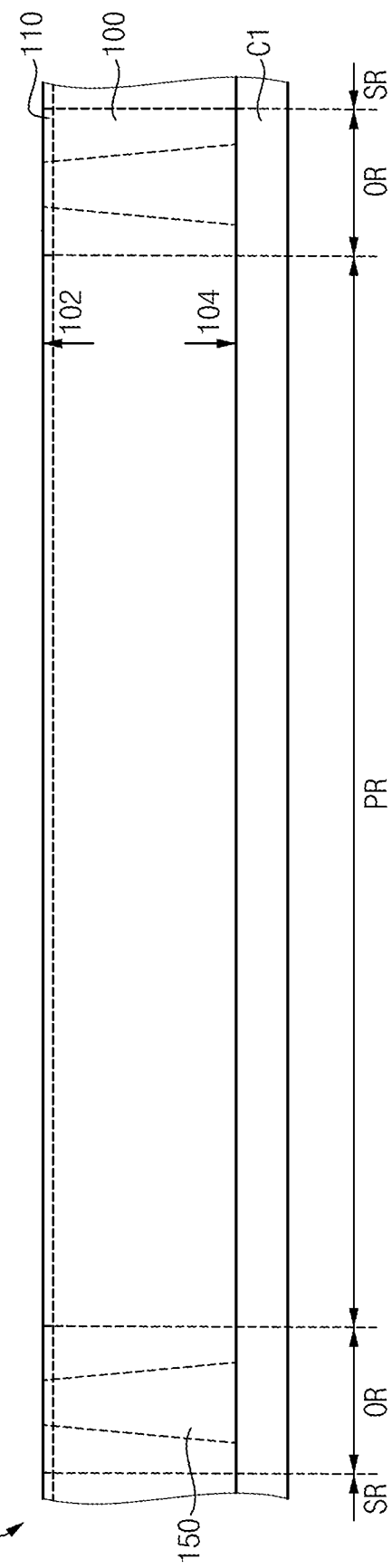

FIGS. 5 to 10 are views illustrating a method of manufacturing the semiconductor device having the semiconductor package in FIG. 1. FIG. 5 is a plan view illustrating a through electrode region on a silicon substrate. FIG. 6 is a cross-sectional view taken along the line C-C' in FIG. 5.

Referring to FIGS. 5 and 6, first, a wafer W on which a plurality of semiconductor chips (dies) are formed may be provided on a substrate carrier C1.

In example embodiments, the wafer W may include a silicon substrate 100 having an upper surface 102 and a lower surface 104 opposite to each other, and an active layer 110 provided on the upper surface 102 of the silicon substrate 100 and having circuit patterns formed therein.

For example, the silicon substrate 100 may include a semiconductor material such as silicon, germanium, or silicon-germanium. The silicon substrate 100 may include a III-V compound semiconductor such as gallium phosphide (GaP), gallium arsenide (GaAs), or gallium antimonide (GaSb). The silicon substrate 100 may include a silicon-on-insulator (SOI) substrate or a germanium-on-insulator (GOI) substrate.

The silicon substrate 100 may have the active layer 110 provided on the upper surface 102. The active layer 110 may include a through opening region OR, and a circuit pattern region PR surrounded by the through opening region and providing a space capable of forming the circuit patterns. The through opening region OR may referred to as a region where a plurality of through electrodes (TSV, through silicon via) are formed.

The through opening region OR may be referred to as a region inside the active layer 110 that does not include metal materials. The through opening region OR may be referred to as a region capable of forming the through electrodes to penetrate the silicon substrate 100 in a thickness direction. The through opening region OR may have any shape such that the through electrodes penetrate through the active layer 110.

The silicon substrate 100 may include a plurality of through openings 150 that penetrate the silicon substrate 100 in a vertical direction. The plurality of through openings 150 may be provided on the through opening region OR.

The circuit pattern region PR may be referred to as a region that the circuit patterns are provided inside the active layer 110. The circuit pattern region PR may include any shape such that the circuit patterns are formed in the active layer 110. The circuit pattern region PR may be spaced apart from the through opening region OR in the active layer 110.

The circuit patterns may include transistors, capacitors, diodes, and the like. The circuit patterns may constitute circuit elements. Thus, the semiconductor chip may be referred to as a semiconductor device in which a plurality of circuit elements are formed. A Front End of Line (FEOL) process for manufacturing semiconductor devices may be performed to form the circuit patterns on the upper surface 102 of the silicon substrate 100. A surface of the silicon substrate on which the FEOL process is performed may be referred to as a front side surface, and a surface opposite to the front side surface may be referred to as a back side surface.

The silicon substrate 100 may include a plurality of die areas where the circuit patterns and cells are formed, and a scribe lane area SR surrounding the die area. The silicon substrate 100 may be individualized by being cut along the scribe lane area that divides the plurality of die areas of the wafer W by a subsequent sawing process.

Figure 7:
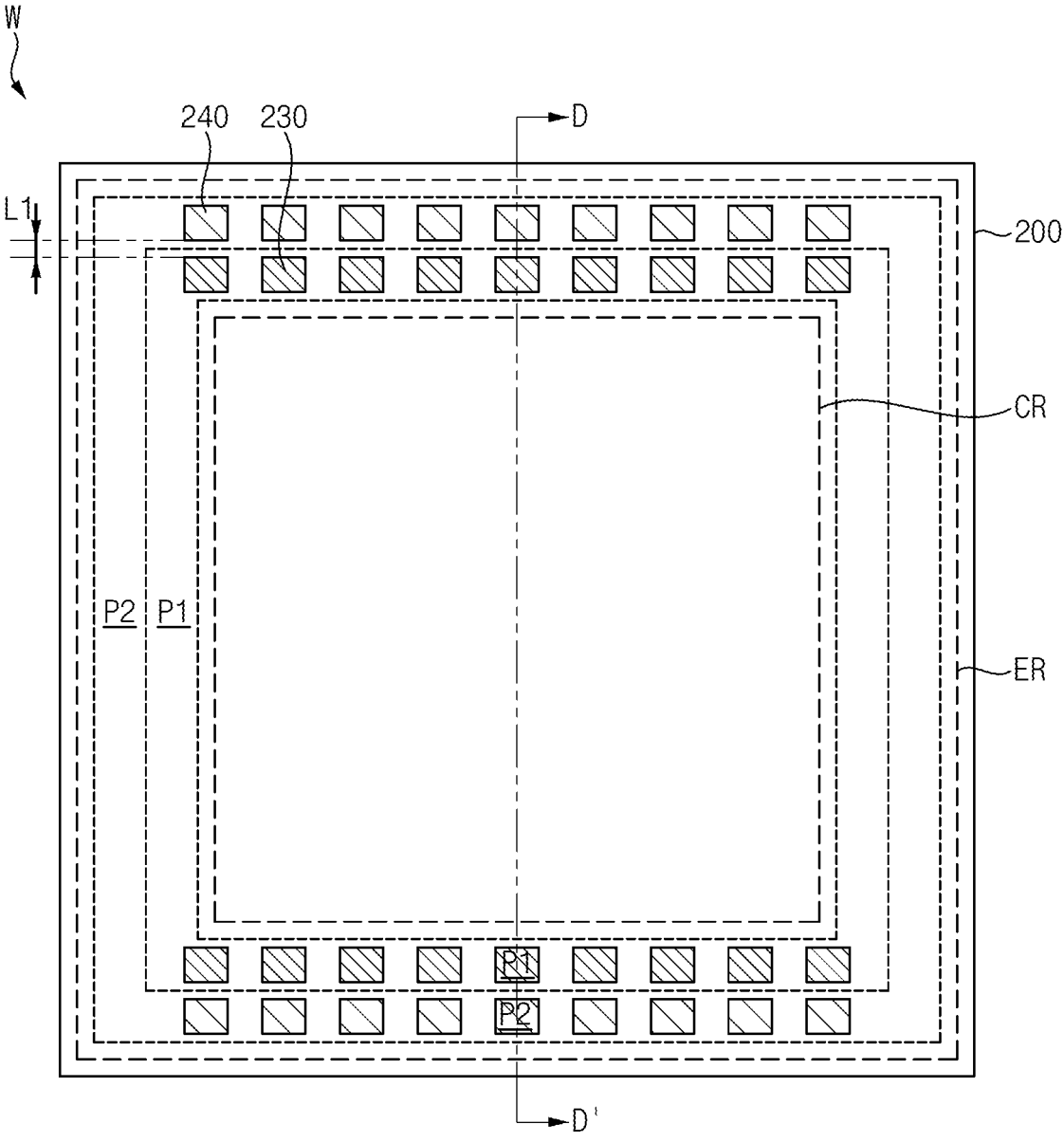
Figure 8:
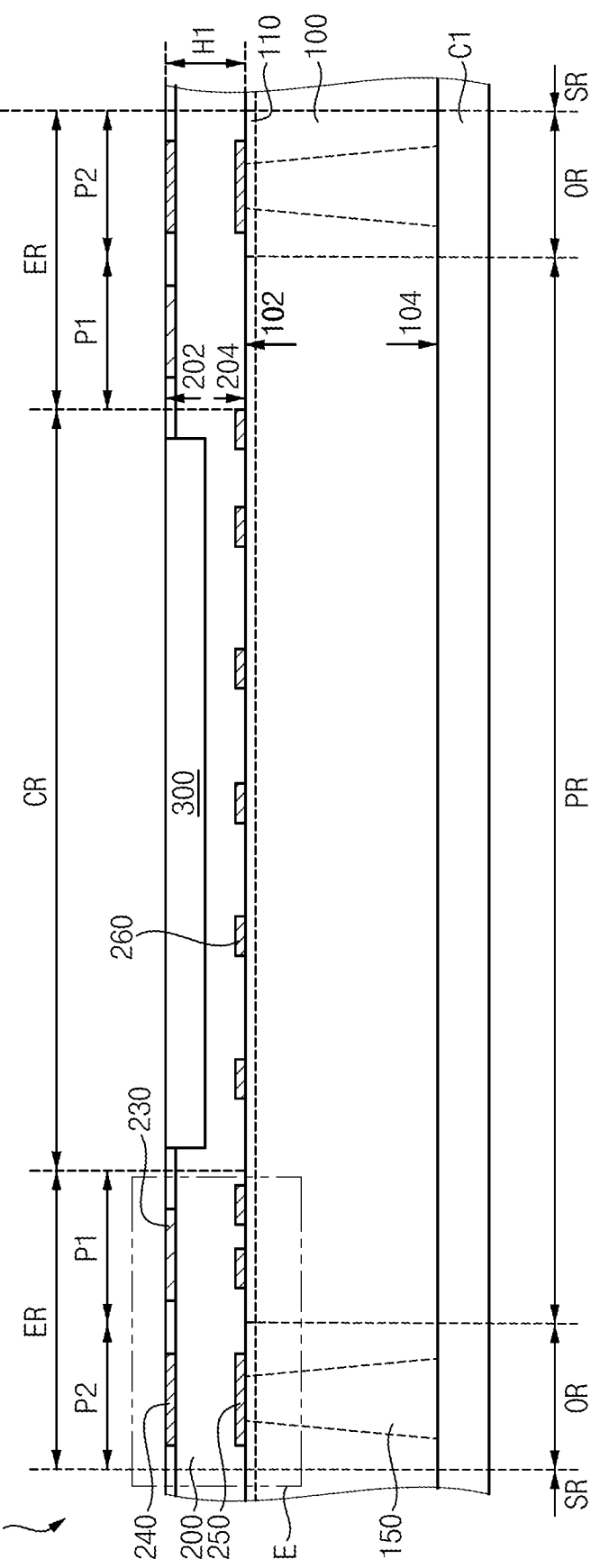
Figure 9:
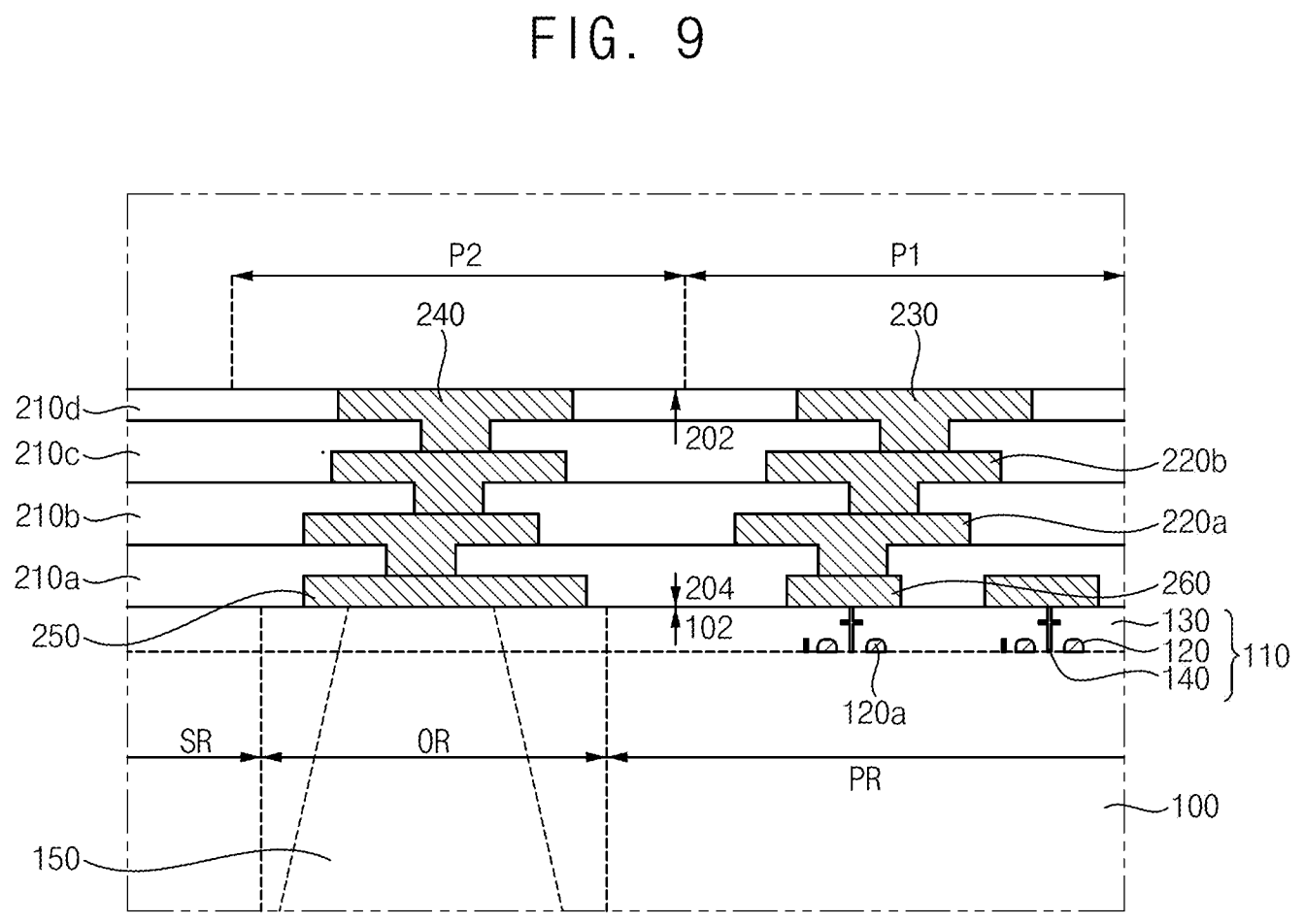

FIG. 7 is a plan view illustrating a redistribution wiring layer formed on a silicon substrate. FIG. 8 is a cross-sectional view taken along the line D-D' in FIG. 7. FIG. 9 is an enlarged cross-sectional view illustrating portion 'E' in FIG. 8.

Referring to FIGS. 7 to 9, a redistribution wiring layer 200 may be formed on the upper surface 102 of the silicon substrate 100.

The redistribution wiring layer 200 may have a central region CR, and an edge region ER surrounding the central region CR. The redistribution wiring layer 200 may have a first pad area P1 and a second pad area P2. The first pad area P1 may be referred to as an area where a plurality of bonding pads 230 electrically connected to bonding wires are formed. The second pad area P2 may be referred to as an area where a plurality of test pad 240 capable of performing reliability test and a plurality of first landing pads 250 electrically connected to the through electrodes are formed. A first surface 202 of the redistribution wiring layer 200 may be spaced apart from a second surface 204 of the redistribution wiring layer 200 to have a first height or second spacing H1.

The first and second pad areas P1 and P2 may be provided on the edge region ER. The first and second pad areas P1 and P2 may be spaced apart from each other. The first pad area P1 may have an area vertically overlapping with the circuit pattern region PR of the silicon substrate 100. The second pad area P2 may have an area vertically overlapping with the through opening region OR of the silicon substrate 100.

First, the first and second landing pads 250 and 260 may be formed on the silicon substrate 100. The first landing pads 250 may be formed on the second pad area P2. The second landing pads 260 may be formed on connection wires that are electrically connected to the circuit patterns. The first landing pads 250 may be formed on the through opening region OR, and the second landing pads 260 may be formed on the circuit pattern region PR. Lower surfaces of the first landing pads 250 may be exposed through the through openings 150 of the silicon substrate 100. Lower surfaces of the first landing pads 250 may be on the through openings 150 of the silicon substrate 100.

Then, a first insulating layer 210a may be formed on the silicon substrate 100 to cover the first and second landing pads 250 and 260. The first insulating layer 210a may be patterned to form first openings that expose or receive the first and second landing pads 250 and 260.

First redistribution wires 220a may be formed on the first insulating layer 210a to directly contact the first and second landing pads 250 and 260 through the first openings. After a seed layer is formed in a portion of the first insulating layer 210a and in the first opening, the seed layer may be patterned and an electroplating process may be performed to form the first redistribution wires 220a. Thus, at least a portion of the first redistribution wires 220a may directly contact the first and second landing pads 250 and 260 through the first opening.

Then, after a second insulating layer 210b is formed on the first insulating layer 210a to cover the first redistribution wires 220a, the second insulating layer 210b may be patterned to form second openings that expose or receive the first redistribution wires 220a. Second redistribution wires 220b directly contacting the first redistribution wires 220a through the second openings may be formed on the second insulating layer 210b.

Then, after a third insulating layer 210c is formed on the second insulating layer 210b to cover the second redistribution wires 220b, the third insulating layer 210c may be patterned to form third openings that expose or receive the second redistribution wires 220b. The bonding pads 230 and the test pads 240 directly contacting the second redistribution wires 220b through the third openings may be formed on the third insulating layer 210c.

Then, after a fourth insulating layer 210d is formed on the third insulating layer 210c to at least partially cover or surround the bonding pads 230 and the test pads 240, respectively, the fourth insulating layer 210d may be patterned to form fourth openings that expose or receive the bonding pads 230 and the test pads 240.

The first landing pads 250 may be electrically connected to the through electrodes that are formed within the through opening 150. The second landing pads 260 may be electrically connected to the circuit patterns 120 through the connection wires 140. The first landing pads 250 may be provided on the second pad area P2 where the test pads 240 are formed. The bonding pads 230 may be provided on the first pad area P1 that is spaced apart from the second pad area P2.

The first landing pad 250 and the bonding pad 230 may be electrically connected through the redistribution wire 220. The first landing pad 250 and the bonding pad 230 may perform a same circuit function. Since the first landing pad 250 and the bonding pad 230 are electrically connected through the redistribution wire 220, a semiconductor package 10 may selectively include the through electrodes provided within the through opening 150 and electrically connected to the first landing pads 250, or the bonding wire electrically connected to the bonding pads 230 in accordance with a purpose.

Since the first landing pad 250 is formed on the same second pad area P2 as the test pad 240, the through opening region OR capable of forming the through electrodes that are electrically connected to the first landing pads 250 may be secured on the silicon substrate 100. The first landing pad 250 and the test pad 240 may be spaced apart from each other to have the first height H1. For example, the first height H1 may be within a range of 10 μm to 20 μm.

The bonding pad 230 and the test pad 240 may be spaced apart from each other to have a first distance L1. Since the bonding pad 230 and the test pad 240 are spaced apart from each other to have the first distance L1, the through opening region OR capable of forming the through electrode may be secured in the silicon substrate 100.

Figure 10:
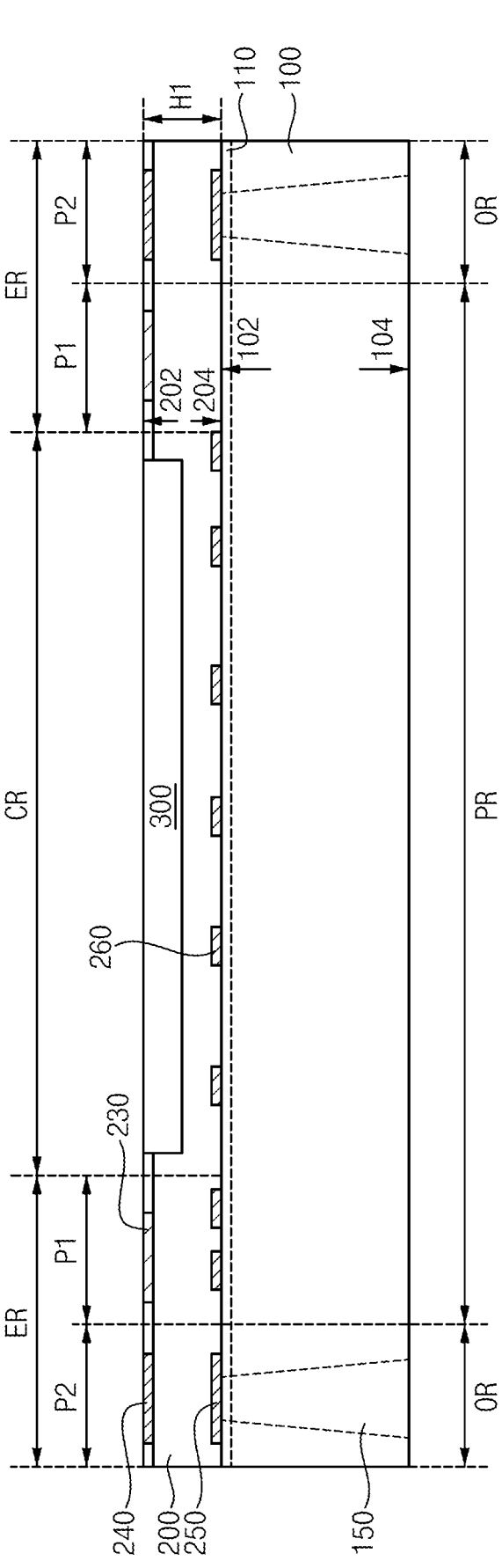

Referring to FIG. 10, the wafer W may be cut along the scribe lane area to complete the individual semiconductor packages 10. The wafer W may be cut by a sawing process.

Figure 11:
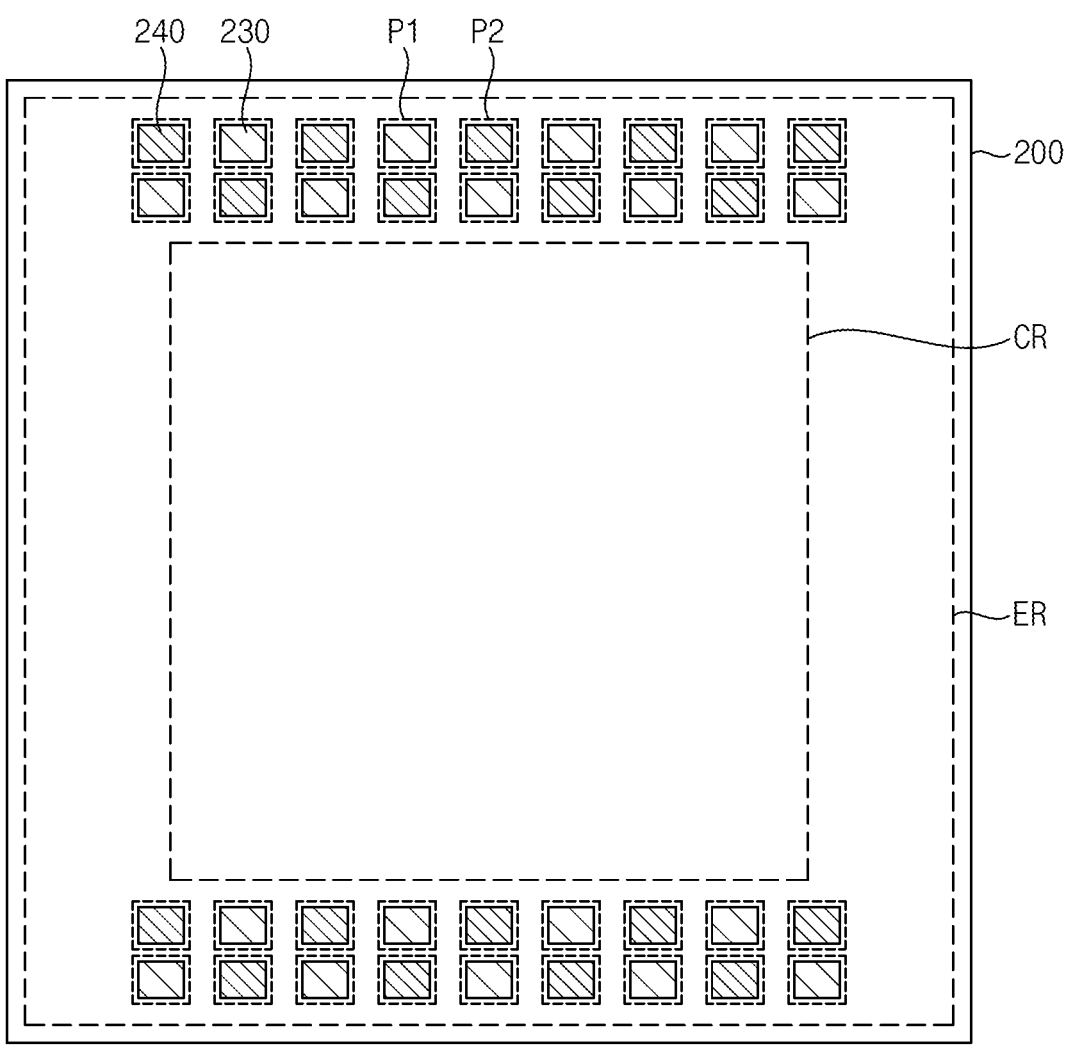

FIG. 11 is a plan view illustrating a semiconductor package having an arrangement of bonding pads and test pads crossing each other in accordance with example embodiments. The semiconductor package may be substantially the same as or similar to the semiconductor package described with reference to FIGS. 1 to 4 except for a configuration of an arrangement of bonding pads and test pads. Thus, same or similar components are denoted by the same or similar reference numerals, and repeated descriptions of the same components may be omitted in the interest of brevity.

Referring to FIGS. 1 to 11, a redistribution wring layer 200 of a semiconductor package 12 may have a central region CR and an edge region ER surrounding the central region CR. The redistribution wiring layer 200 may have a first pad area P1 and a second pad area P2. The first pad area P1 may be referred to as an area where the bonding pads 230 electrically connected to the bonding wires are formed. The second pad area P2 may be referred to as an area where the test pads 240 capable of performing reliability test and the first landing pad 250 electrically connected to the through electrode are formed.

The first and second pad areas P1 and P2 may be provided on the edge area ER. The first and second pad areas P1 and P2 may be spaced apart from each other. The first and second pad areas P1 and P2 may be arranged alternately with each other on the edge region ER. The second pad areas P2 may have an area vertically overlapping with the through opening region OR of the silicon substrate 100.

The bonding pads 230 may be respectively provided on the first pad areas P1. The test pads 240 may be respectively provided on the second pad areas P2. The bonding pads 230 and the test pads 240 may be arranged alternately with each other along the edge region ER (e.g., in first and second parallel horizontal columns or rows). Since the bonding pads 230 and the test pads 240 are arranged alternately with each other, the semiconductor package 12 may be electrically connected to various semiconductor devices through the bonding wire.

Figure 12:
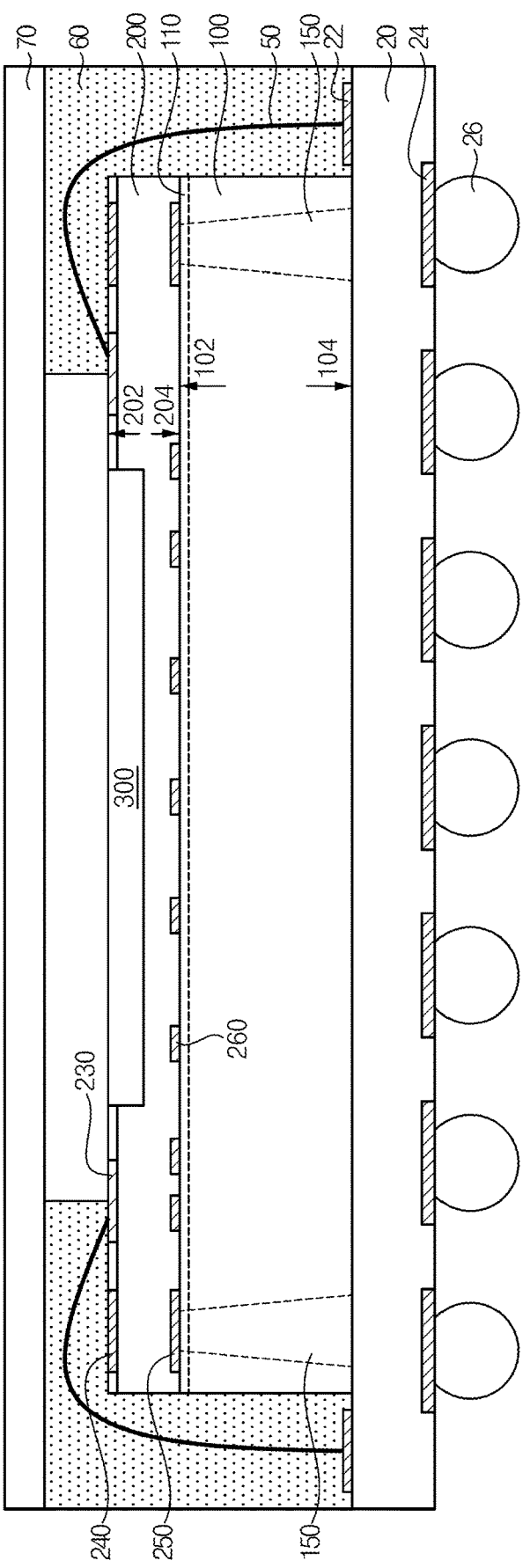

FIG. 12 is a cross-sectional view illustrating a semiconductor package having bonding wires in accordance with example embodiments. The semiconductor package may be substantially the same as or similar to the semiconductor package described with reference to FIGS. 1 to 4 except for a configuration of bonding wires. Thus, same or similar components are denoted by the same or similar reference numerals, and repeated descriptions of the same components may be omitted in the interest of brevity.

Referring to FIGS. 1 to 4 and 12, a semiconductor package 14 may include the silicon substrate 100 having the active layer 110, the redistribution wiring layer 200 provided on the upper surface of the silicon substrate 100, a package substrate 20 on which the silicon substrate 100 is mounted, a plurality of bonding wires 50 capable of electrically connecting the redistribution wiring layer 200 and the package substrate 20, a sealing member 60 covering the plurality of bonding wires 50 on the package substrate 20, and a transparent plate 70 provided on the sealing member 60.

In example embodiments, the package substrate 20 may include a substrate having upper and lower surfaces facing or opposite each other. For example, the package substrate 20 may be referred to as a printed circuit board (PCB). The printed circuit board may be referred to as a multilayer circuit board having vias and various circuits therein.

The package substrate 20 may include a plurality of first substrate pads 22 exposed from or on the upper surface, a plurality of second substrate pads 24 exposed from or on the lower surface, and a plurality of conductive bumps 26 provided on the plurality of second substrate pads 24. For example, the conductive bumps 26 may include C4 bumps.

An adhesive material may be provided between the package substrate 20 and the silicon substrate 100. For example, the adhesive material may include an epoxy material.

In example embodiments, the plurality of bonding wires 50 may electrically connect the first substrate pads 22 of the package substrate 20 and the bonding pads 230 of the redistribution wiring layer 200.

The sealing member 60 may cover or surround a peripheral or side region of the redistribution wiring layer 200 and the bonding wires 50 on the package substrate 20. The sealing member 60 may be provided on the package substrate 20 to cover an outer region of the redistribution wiring layer 200. The sealing member 60 may be in or fill at least a portion of a space between the redistribution wiring layer 200 and the transparent plate 70.

The sealing member 60 may include a through line through which the bonding wire 50 is inserted. One end of the bonding wire 50 within the through line may be electrically connected to the bonding pad 230 of the redistribution wiring layer 200, and other end of the bonding wire 50 within the through line may be electrically connected to the first substrate pad 22 of the package substrate 20.

For example, the sealing member 60 may include an epoxy molding compound (EMC).

In example embodiments, the transparent plate 70 may be provided on the sealing member 60. The transparent plate 70 may include a transparent material capable of transmitting light. The transparent plate 70 may pass light incident from outside to the optical component 300. The transparent plate 70 may protect the optical component 300 from external impact. For example, the transparent plate 70 may include glass, aluminum nitride (AlN), or the like.

Figure 13:
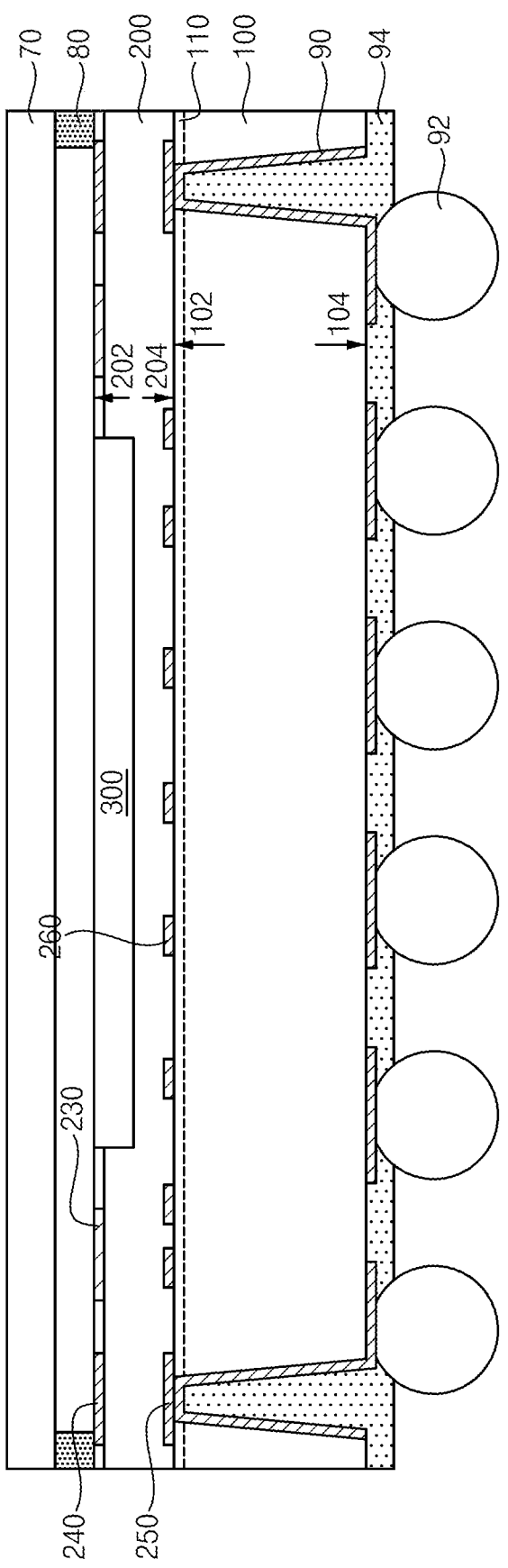

FIG. 13 is a cross-sectional view illustrating a semiconductor package having through electrodes in accordance with example embodiments. The semiconductor package may be substantially the same as or similar to the semiconductor package described with reference to FIGS. 1 to 4 except for a configuration of through electrode. Thus, same or similar components are denoted by the same or similar reference numerals, and repeated descriptions of the same components may be omitted in the interest of brevity.

Referring to FIGS. 1 to 4 and 13, a semiconductor package 16 may include the silicon substrate 100 having the active layer 110, the redistribution wiring layer 200 provided on the upper surface of the silicon substrate 100, a plurality of through electrodes 90 penetrating or extending through the silicon substrate 100 in the vertical direction, external connection bumps 92 provided on the through electrodes 90, an adhesive member 80 provided on the redistribution wiring layer 200, and a transparent plate 70 provided on the adhesive member 80. The semiconductor package 16 may further include a protective member 94 covering or on the through electrodes 90.

In example embodiments, the through electrode 90 may penetrate the silicon substrate 100 in the vertical direction. One end or a first end of the through electrode 90 may be exposed from the upper surface 102 of the silicon substrate 100 through the through opening region OR. The first end of the through electrode 90 may be coplanar with the upper surface 102 of the silicon substrate 100. The first end of the through electrode 90 may be electrically connected to the redistribution wiring layer 200. The other end or second end opposite to the first end of the through electrode 90 may be provided from or at the lower surface 104 of the silicon substrate 100. At least a portion of the second end of the through electrode may be coplanar with the lower surface 104 of the silicon substrate 100.

The first end of the through electrode 90 may be electrically connected to the first landing pad 250 of the redistribution wiring layer 200. For example, the through electrode 90 may include copper (Cu), aluminum (Al), tungsten (W), nickel (Ni), molybdenum (Mo), gold (Au), silver (Ag), chromium (Cr), tin (Sn) and titanium (Ti). However, it is not limited thereto, and the through electrode 90 may include a material capable of being bonded by interdiffusion of metals by a high-temperature annealing process.

The external connection bumps 92 may be provided on the second end of the through electrode 90. The external connection bump 92 may be electrically connected to the first landing pad 250 of the redistribution wiring layer 200 through the through electrode 90. The through electrode 90 may penetrate the silicon substrate 100 in the vertical direction to transmit an electrical signal between the first landing pad 250 and the external connection bump 92. The external connection bumps 92 may provide electrical passages capable of electrically connecting the semiconductor package 16 to other semiconductor devices. For example, the external connection bump 92 may include a C4 bump.

In example embodiments, the protective member 94 may be provided on the lower surface 104 of the silicon substrate 100. The protection member 94 may include an insulating material to protect the silicon substrate 100 from the outside. The protective member 94 may be in or fill an empty space of the through electrode 90. The protective member 94 may protect the through electrode 90 from the outside.

The protective member 94 may include an oxide film or a nitride film. The protective member 94 may include a double layer of an oxide film and a nitride film. The protection member 94 may be formed of an oxide film, for example, a silicon oxide film ($SiO_2$) by a high-density plasma chemical vapor deposition (HDP-CVD) process.

The adhesive member 80 may be in or fill a gap between the redistribution wiring layer 200 and the transparent plate 70 to provide reinforcement. For example, the adhesive member 80 may include a dam (DAM) shape. The adhesive member 80 may include epoxy resin, UV resin, polyurethane resin, silicone resin, or silica filler.

In example embodiments, the transparent plate 70 may be provided on the adhesive member 80. The transparent plate 70 may include a transparent material capable of transmitting the light. The transparent plate 70 may pass the light incident from the outside to the optical component 300.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present disclosure. Accordingly, all such modifications are intended to be included within the scope of example embodiments as defined in the claims.

What is claimed is:

1. A semiconductor package, comprising:
   a silicon substrate comprising a plurality of through openings; and
   a redistribution wiring layer comprising a first surface and a second surface opposite the first surface, the second surface facing the silicon substrate, the redistribution wiring layer comprising a first pad area and a second pad area,
   wherein the redistribution wiring layer includes:
   a plurality of bonding pads on the first pad area at the first surface;

a plurality of test pads on the second pad area at the first surface;

a plurality of landing pads on the second pad area at the second surface, the plurality of landing pads in communication with the plurality of through openings, respectively; and a plurality of redistribution wires electrically connected to the plurality of bonding pads and the plurality of landing pads.

2. The semiconductor package of claim 1, further comprising:

a through electrode in each through opening, the through electrode comprising a first end that is electrically connected to one of the plurality of landing pads;

an external connection bump on a second end of the through electrode opposite the first end of the through electrode;

an adhesive member extending along a peripheral region on the first surface of the redistribution wiring layer; and a transparent plate on the adhesive member.

3. The semiconductor package of claim 1, further comprising:

a semiconductor substrate with the silicon substrate on the semiconductor substrate;

a plurality of bonding wires electrically connecting the semiconductor substrate and the plurality of bonding pads;

a sealing member covering the plurality of bonding wires and on the semiconductor substrate; and a transparent plate on the sealing member.

4. The semiconductor package of claim 1, wherein the redistribution wiring layer further includes a central region and an edge region surrounding the central region, and the first and second pad areas are on the edge region.

5. The semiconductor package of claim 4, wherein the plurality of bonding pads are arranged in a line along the edge region of the redistribution wiring layer on the first pad area.

6. The semiconductor package of claim 4, wherein the plurality of bonding pads and the test pads are arranged alternately in a line along the edge region of the redistribution wiring layer.

7. The semiconductor package of claim 1, wherein a thickness of the redistribution wiring layer is within a range of 10 μm to 20 μm.

8. The semiconductor package of claim 1, wherein a distance between the plurality of bonding pads and the plurality of test pads is within a range of 50 μm to 200 μm.

9. The semiconductor package of claim 1, further comprising:

an optical component on the first surface of the redistribution wiring layer and configured to detect light.

10. The semiconductor package of claim 1, wherein the silicon substrate includes an active layer having circuit patterns that are electrically connected to the plurality of redistribution wires.

11. A semiconductor package, comprising:

a silicon substrate including a plurality of through openings; and a redistribution wiring layer including a first surface and a second surface opposite the first surface, the redistribution wiring layer on the silicon substrate such that the second surface faces the silicon substrate, the redistribution wiring layer including first and second pad areas on an edge region that surrounds a central region, wherein the redistribution wiring layer includes, a plurality of bonding pads on the first pad area at the first surface;

a plurality of test pads on the second pad area at the first surface;

a plurality of landing pads on the second pad area at the second surface, the plurality of landing pads in communication with the plurality of through openings, respectively; and a plurality of redistribution wires electrically connected to the plurality of bonding pads and the plurality of landing pads.

12. The semiconductor package of claim 11, further comprising:

a through electrode in each through opening, the through electrode including a first end that is electrically connected to one of the plurality of landing pads;

an external connection bump on a second end of the through electrode opposite the first end of the through electrode;

an adhesive member extending along a peripheral region on the first surface of the redistribution wiring layer; and a transparent plate on the adhesive member.

13. The semiconductor package of claim 11, further comprising:

a semiconductor substrate with the silicon substrate thereon;

a plurality of bonding wires electrically connecting the semiconductor substrate and the plurality of bonding pads;

a sealing member covering the plurality of bonding wires and on the semiconductor substrate; and a transparent plate on the sealing member.

14. The semiconductor package of claim 11, wherein the plurality of bonding pads are arranged in a line along the edge region of the redistribution wiring layer on the first pad area.

15. The semiconductor package of claim 11, wherein the plurality of bonding pads and the test pads are arranged alternately in a line along the edge region of the redistribution wiring layer.

16. The semiconductor package of claim 11, wherein a thickness of the redistribution wiring layer is within a range of 10 μm to 20 μm.

17. The semiconductor package of claim 11, wherein a distance between the plurality of bonding pads and the plurality of test pads is within a range of 50 μm to 200 μm.

18. The semiconductor package of claim 11, further comprising:

an optical component on the first surface of the redistribution wiring layer and configured to detect light.

19. The semiconductor package of claim 11, wherein the silicon substrate includes an active layer having circuit patterns that are electrically connected to the plurality of redistribution wires.

20. A semiconductor package, comprising:

a silicon substrate;

a redistribution wiring layer on the silicon substrate such that a lower surface of the redistribution wiring layer faces the silicon substrate, the redistribution wiring layer including first and second pad areas on an edge region that surrounds a central region; and a plurality of through electrodes extending through the silicon substrate, wherein the redistribution wiring layer includes:

a plurality of bonding pads on the first pad area at an upper surface of the redistribution wiring layer;

a plurality of test pads on the second pad area at the upper surface of the redistribution wiring layer;

a plurality of landing pads on the second pad area at the lower surface of the redistribution wiring layer, the plurality of landing pads electrically connected to the plurality of through electrodes; and a plurality of redistribution wires electrically connected to the plurality of bonding pads and the plurality of landing pads.

* * * * *